(12) United States Patent
Sakai et al.

(10) Patent No.: US 7,182,879 B2
(45) Date of Patent: Feb. 27, 2007

(54) PLASMA PROCESSING METHOD

(75) Inventors: Itsuko Sakai, Yokohama (JP); Tokuhisa Ohiwa, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 353 days.

(21) Appl. No.: 10/795,296

(22) Filed: Mar. 9, 2004

(65) Prior Publication Data

US 2004/0168766 A1 Sep. 2, 2004

Related U.S. Application Data

(62) Division of application No. 09/877,145, filed on Jun. 11, 2001, now abandoned.

(30) Foreign Application Priority Data

Jun. 12, 2000 (JP) ............................. 2000-175511

(51) Int. Cl.
*C03C 25/68* (2006.01)
(52) U.S. Cl. .......................... 216/59; 216/67
(58) Field of Classification Search .................. 427/9, 427/569; 216/59, 67
See application file for complete search history.

(56) References Cited

U.S. PATENT DOCUMENTS

| | | | |
|---|---|---|---|
| 4,460,673 A * | 7/1984 | Sukigara et al. ............. | 427/578 |
| 4,571,543 A * | 2/1986 | Raymond et al. ............ | 324/425 |
| 5,565,114 A | 10/1996 | Saito et al. .................... | 216/60 |
| 6,224,677 B1 | 5/2001 | Nozawa et al. ............. | 118/715 |
| 6,248,400 B1 * | 6/2001 | Kurihara et al. .......... | 427/249.8 |
| 6,265,033 B1 * | 7/2001 | Hilliard ..................... | 427/561 |
| 6,406,759 B1 * | 6/2002 | Roth .......................... | 427/562 |
| 6,406,924 B1 | 6/2002 | Grimbergen et al. .......... | 438/9 |
| 6,599,842 B2 | 7/2003 | Chao et al. ................. | 438/706 |
| 6,689,699 B2 * | 2/2004 | Sakai et al. ................. | 438/710 |
| 6,782,907 B2 * | 8/2004 | Kawasaki et al. ............ | 137/12 |
| 6,938,638 B2 * | 9/2005 | Kubota et al. .............. | 137/240 |
| 2002/0101167 A1 * | 8/2002 | Shan et al. .............. | 315/111.11 |

FOREIGN PATENT DOCUMENTS

| | | |
|---|---|---|
| JP | 5-040031 | 2/1993 |
| JP | 6-327924 | 11/1994 |
| JP | 7-299321 | 11/1994 |
| JP | 7-36886 | 4/1995 |
| JP | 8-203868 | 8/1996 |
| JP | 9-251981 | 9/1997 |
| JP | 2854240 | 11/1998 |

OTHER PUBLICATIONS

Sakai, et al., "Characterization of SAC Etching in Gas Circultion RIE", *Proceedings of he 2000 Dry Process Symposium*, 55-59 (2000).
Saito et al, "Processing Apparatus", U.S. Appl. No. 09/686,370, filed Oct. 12, 2000.

* cited by examiner

*Primary Examiner*—Bret Chen
(74) *Attorney, Agent, or Firm*—Finnegan, Henderson, Farabow, Garrett & Dunner, L.L.P.

(57) ABSTRACT

A plasma processing method, in which a process gas is introduced into an evacuated process chamber for subjecting the target object to a plasma processing. The plasma processing method is featured in that at least a part of the process gas exhausted from the process chamber is introduced again into the process chamber. A specified value is obtained by monitoring the state of the plasma of the process gas within the process chamber, and the introducing conditions of the process gas into the process chamber are controlled to adjust a predetermined property value to a regulated value.

15 Claims, 3 Drawing Sheets

PLASMA PROCESSING METHOD

CROSS-REFERENCE TO RELATED APPLICATIONS

This is a division of application Ser. No. 09/877,145, filed Jun. 11, 2001, now ABN incorporated herein by reference.

This application is based upon and claims the benefit of priority from the prior Japanese Patent Application No. 2000-175511, filed Jun. 12, 2000, the entire contents of which are incorporated herein by reference.

BACKGROUND OF THE INVENTION

The present invention relates to a plasma processing method, particularly, to plasma processing method in which a reactive gas is introduced into a process chamber for generating a plasma within the process chamber so as to decompose the reactive gas and to process a target substrate.

In a plasma processing apparatus, a target substrate is processed in general by the procedures described below. In the first step, a reactive process gas is introduced into a process chamber exhausted into a vacuum state, followed by applying a high frequency to the reactive process gas so as to generate a plasma and decompose and excite the gas. The target substrate is processed by using the active species thus formed, which has a high reactivity. In a plasma processing apparatus such as a plasma etching apparatus or a plasma CVD apparatus, all the process gas introduced into the process chamber is not consumed for the reaction with the substrate. It is more reasonable to state that a major portion of the process gas introduced into the process chamber is not used for the reaction with the target substrate so as to be exhausted to the outside by an exhaust apparatus. Under the circumstances, it is of high importance to improve the rate of utilization of the process gas so as to decrease the cost of the process gas occupied in the manufacturing cost in the etching or CVD step.

In the etching and CVD processes, various kinds of PFC gases each having a high GWP (global warming potential) are used in large amounts as the process gas and as the cleaning gas of the apparatus. For suppressing the warming of the earth, it is of high importance for the manufacturers of the semiconductor device to take measures for suppressing the discharged amount of the PFC gases. However, it is considered very difficult nowadays to find a substitute gas having a low GWP, having a high safety, and performing the function at least equivalent to that of the PFC gas. It should also be noted that many of the PFC gases are very stable chemically, requiring a novel technology and an apparatus for decomposing and removing the unreacted PFC gas which is contained in the exhaust gas discharged from the process chamber. In other words, a new investment is required for decomposing and removing the unreacted PFC gas.

In the manufacturing process of a semiconductor device, a particularly large amount of the PFC gas is used in the step of etching a silicon oxide film. However, the amount of the PFC gas used for a single apparatus is small, i.e., about 10 to several hundred cubic centimeters (cc) in each processing. In addition, the PFC gas supplied to the process chamber is partly consumed for the reaction with the target substrate, with the result that the amount of the unreacted PFC gas, which is discharged to the outside and should be decomposed and removed, is further decreased. It follows that it is economically impossible to arrange an apparatus for decomposing and removing the unreacted PFC gas for every etching apparatus. Naturally, it is highly important to increase the utilization efficiency of the process gas so as to decrease the discharge amount of the unreacted PFC gas.

An apparatus effective for overcoming the difficulty is proposed in, for example, Japanese Patent Disclosure (Kokai) No. 9-251981. This prior art is directed to a plasma etching apparatus and a plasma CVD apparatus in which a substrate is processed within a vacuum process chamber. It is proposed to arrange a circulating pipe connecting the pipe on the discharge side to the process chamber so as to return a part of the discharged gas back into the process chamber for reuse.

Figure 1:
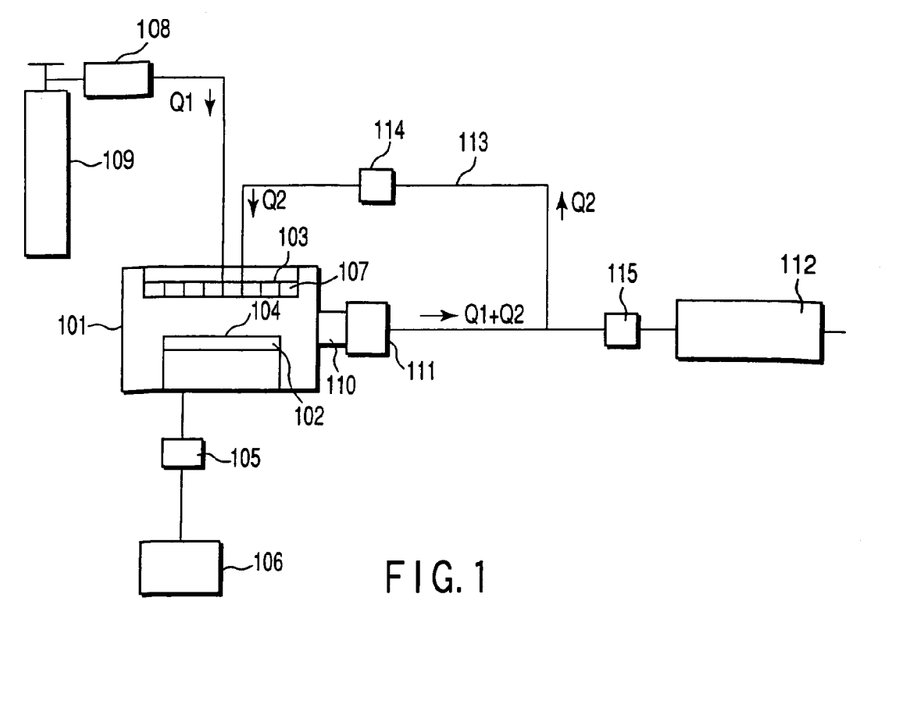
FIG. 1 is a block diagram schematically showing the construction of a conventional plasma processing apparatus.

A silicon wafer is etched in a DRM type plasma etching apparatus equipped with a circulating mechanism while circulating a process gas. FIG. 1 schematically shows the construction of the etching apparatus used. As shown in the drawing, a parallel plate type plasma generating apparatus comprising a cathode electrode 102 and an anode electrode 103, which are arranged to face each other, is arranged within a process chamber 101, and a parallel magnetic field is generated within the process chamber 1 by using a magnetic field applying apparatus (not shown). A target substrate 104, which is to be processed, is disposed on the cathode electrode 102, and a high frequency power source 106 is connected to the cathode electrode 102 with a matching circuit 105 interposed therebetween. On the other hand, a shower nozzle 107 for uniformly supplying a process gas onto the target substrate 104 is incorporated in the anode electrode 103. A gas cylinder 109 used as a supply source of the process gas is connected to the shower nozzle 107 with at least one flow rate controller 108 interposed therebetween. The apparatus shown in the drawing includes one flow rate controller 108 and one gas cylinder 109. However, it is possible to determine appropriately the number of flow rate controllers and the number of steel gas cylinders, as required.

A turbo molecular pump 111 is connected to the process chamber 101 with a pressure control valve 110 interposed therebetween, and a dry pump 112 is connected to the exhaust side of the turbo molecular pump 111. Also, a circulating pipe 113 is arranged between the exhaust side of the turbo molecular pump 111 and the process chamber 101. A flow rate control valve 114 is mounted to the circulating pipe 113 for controlling the circulating rate. Also, another flow rate control valve 115 is arranged upstream of the dry pump 112.

For processing the target substrate by using the apparatus shown in the drawing, gases of $C_4F_8$, CO, Ar and $CO_2$ are supplied at a predetermined flow rate ratio from the gas cylinder 109 into the process chamber 101 through the flow rate controller 108. At the same time, the flow rate control valve 114 mounted to the circulating pipe 113 is opened, and the degree of opening of the flow rate control valve 115 arranged upstream of the dry pump 112 is decreased. A part of the exhaust gas discharged from the process chamber 101 by the operation of the turbo molecular pump 111 is returned into the process chamber through the circulating pipe 113. In other words, since the exhausted process gas is utilized again so as to decrease the amount of the newly introduced gas, compared with the case where the exhaust gas is not returned partly into the process chamber.

Figure 2:
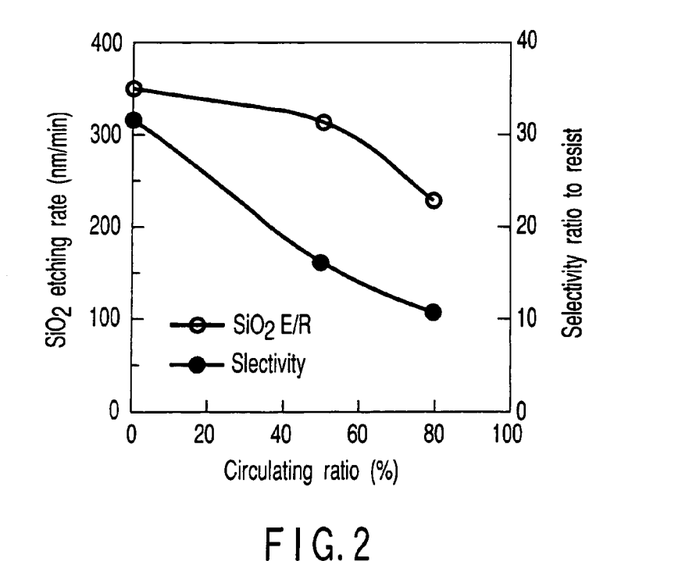
FIG. 2 is a graph showing the relationships between the circulating ratio and the $SiO_2$ etching rate and between the circulating ratio and the selectivity to resist.

The apparatus shown in FIG. 1 permits increasing the utilization rate of the process gas because the process gas is partly circulated within the process chamber so as to decrease the amount of the process gas used. However, the etching characteristics are changed and deteriorated by the circulation of the process gas. FIG. 2 is a graph showing the relationship between the silicon dioxide etching rate and the process gas circulation rate.

Specifically, FIG. 2 shows the change in the etching characteristics in the SAC (Self-Aligned Contact) forming process of an oxide film, covering the case where the circulating rate of the process gas is changed from 0% to 80%. The circulating rate was changed by controlling the valve 115 while maintaining constant the total gas flow rate, i.e., the sum of the newly introduced gas flow rate and the circulated gas flow rate, into the process chamber. On the other hand, the change in the etching characteristics was evaluated in terms of the $SiO_2$ etching rate and the selectivity to resist.

As apparent from the graph of FIG. 2, each of the etching rate and the selectivity was lowered with increase in the circulating rate. It should be noted in this connection that the circulating gas introduced again into the process chamber 101 and the gas newly introduced into the process chamber 101 differ from each other in the composition and the flow rate ratio.

Figure 3:
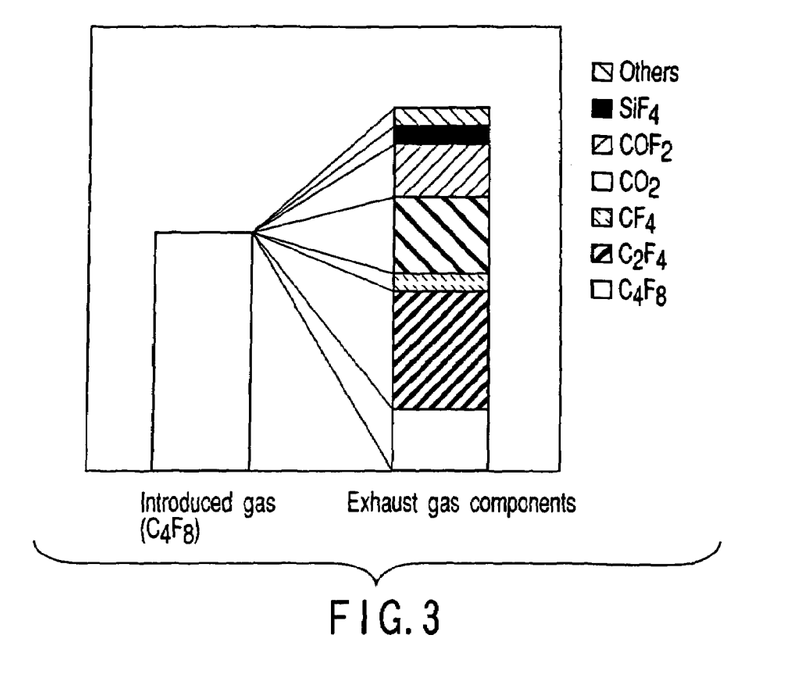
FIG. 3 is a graph showing the components of the introduced gas and the exhausted gas.

FIG. 3 shows the result of the analysis of the components of the exhaust gas, covering the case where the etching was performed with the circulating ratio set at 0%. In FIG. 3, CO and Ar having a relatively high flow rate are omitted. The introduced gas, i.e., the base gas $C_4F_8$, which is a PFC gas, is partly decomposed by the plasma discharge so as to be involved in the etching reaction and to be adsorbed on the inner wall of the process chamber and partly remains unreacted so as to be discharged as it is to the outside as the exhaust gas. On the other hand, FIG. 3 clearly shows that the reaction products formed by the discharge and the etching reaction are also exhausted to the outside.

In order to avoid the problem in terms of the change and deterioration of the processing characteristics, proposed is a method of mounting a gas refining mechanism to the circulating pipe such that the exhaust gas is refined and, then, returned into the process chamber. For example, proposed in each of Japanese Patent Publication (Kokoku) No. 7-36886 and Japanese Patent No. 2854240 is an idea of mounting to the circulating pipe a refining mechanism such as an adsorption tower, a dehydrating tower, a decarboxylation tower, and a filter and a gas analyzer for monitoring the state of the refining mechanism so as to regenerate a gas exactly equal to the newly introduced gas in the composition and the component ratio. It is proposed that the regenerated gas is introduced into the process chamber so as to maintain the characteristics of the process gas. Another idea is proposed in, for example, Japanese Patent Publication No. 5-40031. Specifically, it is proposed to refine the exhaust gas to obtain another raw material that should originally be stored in another gas cylinder in place of refining the exhaust gas to obtain a refined gas exactly equal in composition to the newly introduced gas as in the method of forming a silicon film. Each of these prior arts is intended to maintain the processing characteristics on the basis that the gas returned into the process chamber is known. In order to achieve the object, required are many costly facilities in addition to the gas circulating mechanism. Since in the plasma etching apparatus, a small amount of a high purity gas is supplied into the process chamber while controlling the gas amount in units of sccm or less, the technology proposed in the prior arts pointed out above is not practical.

Under the circumstances, it is practical and economical in the plasma etching process to return the exhaust gas as it is into the process chamber for reuse without particularly refining the components of the exhaust gas. In this case, however, a gas having an unknown gas component mixed therein at an unknown mixing ratio is introduced into the process chamber, making it necessary to set the gas flow rate condition appropriately.

Where the conditions of an etching process are newly established on the basis that a gas is circulated at a fixed circulating rate, a problem particularly different from that of the prior art does not take place. However, the work to reconstruct the flow rate conditions of the gas introduction starting with zero is generated separately. The particular work is required in the case where the process, in which measures are not taken for the environment relating to the gas circulation, is changed into another process in which a gas is circulated as a measure for the environment. In other words, the particular work is required in the case where the etching characteristics under the process conditions constructed without circulating the gas are to be reproduced while circulating the gas.

To be more specific, a target substrate is etched by changing in a matrix fashion the flow rate of each of the introduced gases including $C_4F_8$, $O_2$, CO and Ar. Then, it is necessary to determine the new gas introducing conditions while confirming the etching characteristics such as the etching rate, the selectivity and the shape of the etched target substrate by measuring the film thickness scores of times and by observing the cross sections with an SEM 10 to 20 times. It is possible to decrease markedly the discharge amount of the PFC gas by these operations. However, a tremendously long time and high cost are required for finding the new gas introducing conditions. In other words, required is a tremendously high material cost including not only the wafer cost but also the gas cost.

In addition, if the circulation ratio is increased in order to improve the effect of suppressing the PFC gas discharge, the ratio of the circulated gas to the newly introduced gas is increased, with the result that the influence given by the circulated gas component to the process is relatively increased. Under the circulation of, for example, 80%, the change in the flow rate of the newly introduced gas by 1 sccm corresponds to the change in the flow rate of the circulated gas by 4 sccm. It follows that it is necessary to control highly accurately the flow rate of the introduced gas and to maintain the controlled flow rate.

BRIEF SUMMARY OF THE INVENTION

The present invention, which has been achieved in view of the situation described above, is intended to provide a plasma processing method capable of realizing efficiently the process characteristics equivalent or superior to the case where the gas circulation is not performed while suppressing the consumption of the process gas including the PFC gas, reducing the GWP equivalent discharge amount, and reducing the manufacturing cost and the load on the environment.

According to a first aspect of the present invention, there is provided a plasma processing method, in which a process gas is introduced into an evacuated process chamber for subjecting a target object to a plasma processing, comprising:

introducing again at least a part of the process gas exhausted from the process chamber into the process chamber;

obtaining specified values by monitoring the state of the plasma of the process gas within the process chamber; and controlling the introducing conditions of the process gas into the process chamber so as to adjust a predetermined property value to a regulated value.

According to a second aspect of the present invention, there is provided a plasma processing method, in which a process gas is introduced into an evacuated process chamber for subjecting a target object to a plasma processing, comprising:

introducing again at least a part of the process gas exhausted from the process chamber into the process chamber;

obtaining specified values by monitoring the state of the plasma of the process gas within the process chamber; and controlling the introducing conditions of the process gas into the process chamber so as to adjust a predetermined property value to a regulated value;

wherein the predetermined property value is a property value allowing the change in the state of the plasma in changing the circulating ratio, which is a ratio of the flow rate of the process gas introduced again into the process chamber to the flow rate of the entire process gas introduced into the process chamber, to be correlated to the process characteristics of the target substrate; and the regulated value represents the property value obtained before changing the circulating ratio.

According to a third aspect of the present invention, there is provided a plasma processing method, in which a process gas is introduced into an evacuated process chamber for forming a thin film on the surface of a target object, comprising:

introducing again at least a part of the process gas exhausted from the process chamber into the process chamber while processing a thin film formed of the same material;

monitoring the rate of change in the thickness of the thin film formed on the surface of the target substrate within the process chamber; and controlling the introducing conditions of the process gas into the process chamber in changing the circulating ratio of the process gas into the process chamber so as to allow the rate of change in the thickness of the thin film to form a regulated value; wherein the regulated value is a rate of change in the thickness of the thin film obtained before changing the circulating ratio.

Further, according to a fourth aspect of the present invention, there is provided a plasma processing method, in which a process gas is introduced into an evacuated process chamber so as to process a thin film on the surface of a target substrate, comprising:

introducing again at least a part of the process gas exhausted from the process chamber into the process chamber;

monitoring the rate of change in the thickness of a thin film formed on the surface of the target substrate within the process chamber; and controlling the introducing conditions of the process gas into the process chamber in changing the circulating ratio of the process gas introduced again into the process chamber so as to adjust the rate of change in the thickness of the thin film to a regulated value;

wherein the regulated value is the rate of change in the thickness of the thin film obtained before changing the circulating ratio.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The plasma processing method of the present invention will now be described in detail with reference to the accompanying drawings.

EXAMPLE 1

In Example 1, the recipe for SAC used in the conventional apparatus, which is not equipped with a circulating mechanism, is applied to the etching of a silicon oxide film performed by using a DRM (Dipole-Ring Magnet) type plasma etching apparatus equipped with a circulating mechanism while circulating the process gas. In other words, the circulating ratio was changed in Example 1.

Figure 4:
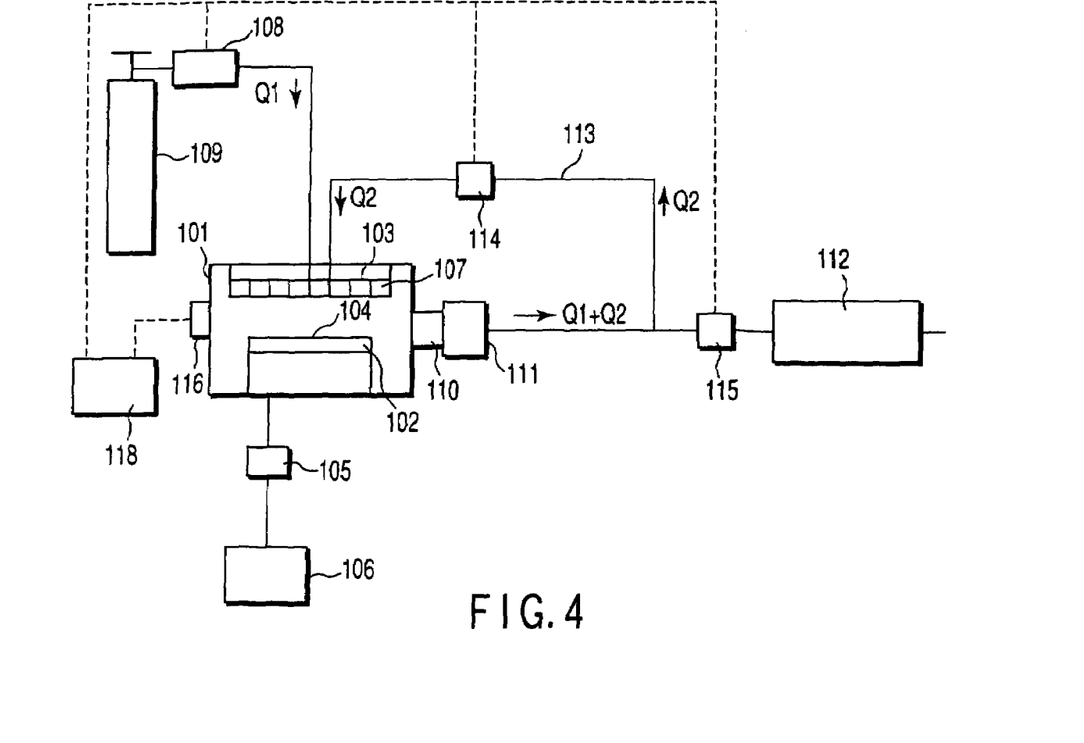
FIG. 4 is a block diagram schematically showing the construction of an example of a plasma processing apparatus used in the plasma processing method of the present invention.

FIG. 4 schematically shows the construction of the plasma etching apparatus used. Those portions of the apparatus shown in FIG. 4 which are equal to the apparatus shown in FIG. 1 are denoted by the same reference numerals so as to avoid an overlapping description. As shown in FIG. 4, a light emission monitor 116 for monitoring the light emission from the plasma is arranged within the process chamber 101. What should be noted is that, in Example 1, the exhaust gas is circulated into the process chamber, and the light emission characteristics of the plasma within the process chamber 101 into which the exhaust gas is circulated are monitored by the light emission monitor 116. As shown in the drawing, the exhaust gas is circulated into the process chamber 101 without adjusting substantially the components of the exhaust gas. Also, the result obtained by the light emission monitor 116 is supplied to a feedback means 118. The target substrate is etched while controlling the flow rate of the newly introduced gas and the flow rate of the circulated gas by adjusting the flow rate controller 108, and the flow rate control valves 114, 115 on the basis of the signal generated from the feedback means 118.

Figure 5:
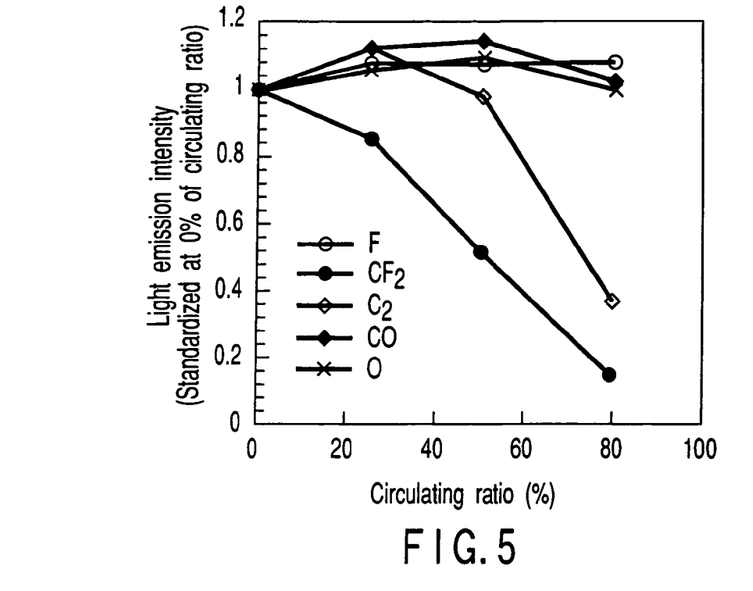
FIG. 5 is a graph showing the relationship between the circulating ratio and the light emission intensity.

An etching treatment was performed while circulating the process gas by using the plasma etching apparatus shown in FIG. 4. In the first step, the circulating ratio was changed in the SAC (Self-Aligned Contact) forming process so as to examine the change in the light emission intensity of each gas accompanying the change in the circulating ratio, with the result as shown in a graph of FIG. 5. To be more specific, the circulating ratio was changed from 0% to 80% while maintaining constant the total gas flow rate introduced into the process chamber so as to measure the change in the light emission intensity of F, $CF_2$, $C_2$, CO and O. FIG. 5 shows the result standardized with the circulating ratio of 0%. It is possible to optionally change the circulating ratio by changing the flow rate of the process gas supplied into the process chamber or the flow rate of the process gas introduced again into the process chamber.

As shown in the graph of FIG. 5, the light emission intensity of, particularly, $CF_2$ among F, $CF_2$, $C_2$, CO and O is lowered with increase in the circulating ratio. As already described with reference to FIG. 2, the etching rate of an oxide film is lowered with increase in the circulating ratio. The tendency of the decrease in the light emission intensity of $CF_2$ resembles the tendency of the etching rate shown in FIG. 2.

What should be noted is that the present inventors have found for the first time that the light emission intensity of $CF_2$ is strongly related to the etching rate of the oxide film. In this case, the light emission intensity of $CF_2$ corresponds to a predetermined property value specified in the present invention, and the etching rate of the oxide film corresponds to the process characteristics of the target object specified in the present invention.

Based on the finding described above, the contact hole forming process under the conventional process conditions without involving the circulation was reproduced in Example 1 in the circulating mode as follows. In the first step, the gas introducing conditions of each of $C_4F_8$/CO/Ar/$O_2$, which were introduced into the process chamber 101, were set at 20% of the conventional conditions. In other words, the gas introducing conditions of each of $C_4F_8$/CO/Ar/$O_2$ were set at $C_4F_8$/CO/Ar/$O_2$=2/10/40/1 sccm, and the circulating ratio was set at 80% by adjusting the flow rate control valves 114 and 115. In Example 1, the total gas flow rate introduced into the process chamber 101, i.e., the sum of the flow rate of the newly introduced gas and the flow rate of the circulated gas that is introduced again, was equal to that in the conventional case where the gas was not circulated.

In this case, the intensity of the light emission caused by $CF_2$ was lowered as shown in FIG. 5. Then, when the flow rate of $C_4F_8$ introduced into the process chamber 101 was increased to 6 sccm, the intensity of light emission from $CF_2$ was rendered substantially equal to that in the conventional case in which the gas was not circulated. It has been found that the etching rate of the oxide film also reproduced the conventional case where the gas was not circulated. To be more specific, the intensity of light emission from $CF_2$ was 0.04 when the flow rate of $C_4F_8$ was 2 sccm and was 0.40 when the flow rate was 6 sccm. Also, the etching rate of the oxide film was 413 nm/min. On the other hand, the light emission intensity of $CF_2$ and the etching rate of the oxide film in the conventional case where the gas was not circulated were found to be 0.41 and 405 nm/min, respectively. The experimental data support that it was possible to reproduce the light emission intensity of $CF_2$ and the etching rate of the oxide film in the conventional case where the gas was not circulated. In other words, it has been found possible to reproduce the regulated value specified in the present invention, i.e., the light emission intensity of $CF_2$ in the case where the circulating ratio was 0%.

The result described above was obtained in a very short time and by etching about two wafers. Then, the shape of the etching was corrected by performing a fine adjustment in the flow rates of the other gases by using additional wafer samples. As a result, it has been found possible to reproduce the etching characteristics exactly equal to those under the conventional conditions with a high efficiency by using a minimum process gas and with the minimum number of wafers.

In Example 1, the light emission intensity of $CF_2$ within the process chamber in the case where the gas is not circulated is defined as the regulated value. The etching was performed while circulating the exhaust gas by controlling the introducing conditions of the process gas supplied into the process chamber such that the light emission intensity of $CF_2$ within the process chamber conforms with the regulated value.

As described above, the introducing conditions of the process gas supplied into the process chamber were controlled in Example 1 on the basis of the light emission intensity of $CF_2$ within the process chamber, making it possible to decrease not only the amount of the gas used but also the discharged amount of the PFC gas by about 70%. As a result, the load applied to the PFC removing system was further lowered, and the frequency of renewing the columns was also decreased. Further, it was possible to markedly decrease the wafer, the process gas and the working time for optimization of the process conditions.

EXAMPLE 2

In Example 2, feedback was applied to the control of the flow rate in the introducing system of the etchant gas in a manner to maintain constant the light emission intensity of $CF_2$ under the same working process. As a result, it was possible to suppress to a low level the difference among the wafers, the difference among the lots, and difference among the apparatuses.

EXAMPLE 3

In Example 3, a specified processing was performed by etching a silicon oxide film with a plasma etching apparatus equipped with a gas circulating mechanism. In this case, the flow rate of the introduced gas was adjusted and made optimum in a manner to permit the etching rate to be constant while measuring the etching rate of the film to be etched with an in-situ film thickness monitor in place of the measurement of the light emission.

Figure 6:
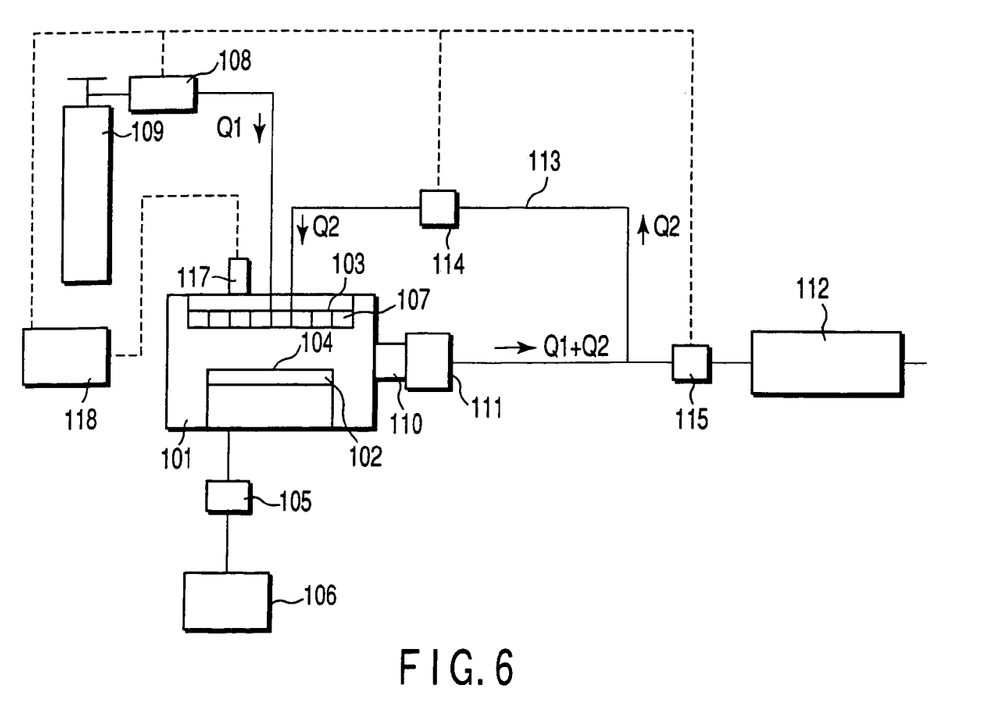
FIG. 6 is a block diagram schematically showing the construction of another example of a plasma processing apparatus used in the plasma processing method of the present invention.

FIG. 6 schematically shows the construction of the etching apparatus used. Those portions of the apparatus which are common with the apparatus shown in FIG. 1 are denoted by the same reference numerals so as to avoid an overlapping description. As shown in FIG. 6, a film thickness monitor 117 for measuring the thickness of a target film to be etched is arranged within the process chamber 101. The result obtained by the film thickness monitor 117 is supplied to the feedback means 118. The target film was etched while controlling the flow rate of the newly introduced gas and the flow rate of the circulating gas by adjusting the flow rate controller 108 and the flow rate control valves 114 and 115.

As a result, it has been found possible to reproduce efficiently the working characteristics in the case of changing the circulating ratio. Particularly, it was possible to maintain stable working characteristics in Example 3 because the etching rate was kept monitored and fed back to the flow rate of the introduced gas.

In Example 3, the rate of change in the thickness of the thin film formed on the surface of the target substrate in the case where the gas is not circulated is used as a regulated value. The etching was performed while circulating the exhaust gas by controlling the flow rate of the circulated gas while controlling the introducing conditions of the process gas supplied into the process chamber such that the rate of change in the thickness of the thin film formed on the surface of the target substrate constitutes the regulated value.

In the case of Example 3, in which the introducing conditions of the process gas into the process chamber were controlled on the basis of the rate of change in the thickness of the thin film, it was possible to decrease not only the amount of the gas used but also the discharged amount of the PFC gas.

Also, it is possible to use the film thickness monitor 117 in combination with the light emission monitor used in each of Examples 1 and 2. For example, in the case where the etching rate of resist was adjusted with the film thickness monitor (detection of etching rate) while adjusting the etching rate of a silicon oxide film on the basis of the detected signal of $CF_2$ with the light emission monitor, it was possible to further improve the control characteristics of the etching characteristics.

In each of the Examples described above, the light emission intensity of $CF_2$ was used for monitoring the state of the plasma. However, the present invention is no limited to the particular case. For example, it is possible to monitor the state of the plasma by using, for example, an impedance monitor of plasma or a quadruple pole mass analyzing apparatus. Also, where a slight delay in time does not pose a problem, it is possible to monitor the exhaust gas reflecting the state of the plasma by using a quadruple pole mass analyzing apparatus or an FT-IR analytical apparatus. It should be noted, however, that it is particularly desirable to monitor the light emission intensity of $CF_2$ because the particular method is stable in the correlation with the working characteristics, and the particular method can be worked easily.

The technical idea of the present invention can be employed particularly suitably in a single process step for etching a thin film made of the same material. The etching of the thin film made of the same material includes an over-etching.

As described above, the present invention can be employed for not only the etching of a silicon oxide film but also the cleaning of a plasma CVD apparatus.

EXAMPLE 4

Example 4 is directed to the cleaning treatment with a parallel plate type plasma CVD apparatus equipped with a gas circulating function.

In the first step, a silicon oxide film was deposited in a thickness of 2 μm on a silicon wafer, followed by taking out the wafer. Then, a process gas containing $C_2F_6$, $O_2$ and Ar was introduced into a process chamber so as to remove the silicon oxide film attached to the inner surface of the process chamber. In Example 4, the silicon oxide film attached to the inner surface of the process chamber corresponds to the target object specified in the present invention, and the removal rate of the silicon oxide film corresponds to the processing characteristics specified in the present invention. The amounts of $C_2F_6$, $O_2$, and Ar newly introduced into the process chamber were set at 20 sccm, 40 sccm and 40 sccm, respectively. Further, the exhausted gas was introduced again into the process chamber with a circulating ratio of 90%.

Since the flow rate of the exhaust gas introduced again into the process chamber was: $C_2F_6/O_2/Ar=180/360/360$ sccm, the total flow rate of the gas introduced into the process chamber was: $C_2F_6$ 200 sccm+$O_2$ 400 sccm+Ar 400 sccm=1000 sccm.

Compared with the case where the gas was newly introduced into the process chamber with the same total flow rate without circulating the exhaust gas, it was possible to decrease each of the gas introducing amount and the discharge amount of the gas by at least 90% by circulating the exhaust gas at a circulating ratio of 90%. However, since the gas ratio introduced into the process chamber was not appropriate, a long time was required for the cleaning.

Then, after the pressure was stabilized at 3 Torr, the etching of the silicon oxide film was started by the plasma discharge, and the circulating ratio was controlled by changing the flow rate of the $O_2$ gas into the process chamber every 15 seconds while maintaining the gas flow rates of $C_2F_6$ and Ar. In this case, the gas ratio was controlled by changing the flow rate of the $O_2$ gas supplied into the process chamber to 0, 8, 16, 24, 32, 40, 48 and 56 sccm every 5 seconds. On the other hand, the circulating ratio was controlled by changing the flow rate of the circulated gas. While controlling the gas ratio and the circulating ratio, the light emission intensity of $SiF_4$ was monitored by an emission spectrometer. $SiF_4$ is a reaction product released to the outside in accordance with removal of the silicon oxide film by the etching. It should be noted that the light emission intensity of $SiF_4$ corresponds to the property value relating to the process characteristics of the target object specified in the present invention. The light emission intensity of $SiF_4$ exhibited the maximum value when the flow rate of the $O_2$ gas introduced into the process chamber was 32 sccm. It follows that it is possible to estimate that the removal rate of the silicon oxide film reaches the maximum value in the case of introducing the $O_2$ gas at the flow rate noted above. It is certainly possible to further decrease the amount of the introduced gas, if the circulating ratio is set at a higher level. If the circulating ratio is further increased, however, the characteristics are deteriorated. On the other hand, if the circulating ratio is low, it is certainly possible to improve the characteristics. However, the amount of the gas used or released to the outside is increased.

The cleaning rate of the silicon oxide film having a thickness of 2 μm was confirmed by using the gas condition thus found. It has been confirmed that it is possible to markedly decrease the amount of the $C_2F_6$ gas used and released to the outside without bringing about the reduction in the cleaning rate by using the optimized gas circulating process.

As described above, the present invention provides a plasma processing method capable of efficiently reproducing the process characteristics equivalent or superior to the case where the gas circulation is not performed while decreasing the amount of the process gas used including the PFC gas and the GWP equivalent discharge amount so as to lower the manufacturing cost and the load on the environment.

The present invention can be used highly effectively for a plasma etching, particularly, for the etching of a silicon oxide film and, thus, has a very high industrial value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing method comprising:
newly introducing a process gas into an evacuated process chamber to generate plasma, the evacuated process chamber having a thin film attached to an inner surface thereof;
performing a plasma processing of the thin film to reduce a thickness of the thin film;
exhausting the process gas from the evacuated process chamber;
introducing again at least a part of the process gas exhausted from the process chamber into the process chamber while processing the thin film;
monitoring a rate of change in the thickness of the thin film corresponding to a circulating ratio of the process gas into the process chamber, the circulating ratio being a ratio of a flow rate of the process gas introduced again into the process chamber to a flow rate of an entire introduced gas, the flow rate of the entire introduced gas being a sum of the newly introduced process gas and the exhausted process gas introduced again; and
controlling an introduction condition of the process gas into the process chamber so as to adjust the rate of change in the thickness of the thin film to a regulated value, the introduction condition of the process gas being controlled in accordance with changing the circulating ratio,
wherein the regulated value is a rate of change in the thickness of the thin film obtained before changing the circulating ratio.

2. The plasma processing method according to claim 1, wherein the rate of change in the thickness of the thin film is measured by monitoring a state of the plasma of the process gas within the process chamber.

3. The plasma processing method according to claim 1, wherein the introduction condition of the process gas is controlled by controlling the flow rate of the process gas newly introduced into the process chamber.

4. The plasma processing method according to claim 1, wherein the process gas newly introduced into the process chamber is a mixed gas containing at least two kinds of gaseous components; and the introducing condition of the process gas is controlled by controlling a flow rate ratio of the gaseous components of the mixed gas.

5. The plasma processing method according to claim 1, wherein the process gas introduced into the process chamber contains a gaseous component having C and F, the thin film is a silicon oxide film and processed by an etching process, and a state of the plasma of the process gas within the process chamber is an intensity of light emission from $CF_2$ radicals.

6. The plasma processing method according to claim 1, wherein at least a part of the process gas exhausted from the process chamber is introduced again into the process chamber without adjusting substantially components of the process gas.

7. The plasma processing method according to claim 1, wherein before said introducing again at least a part of the process gas, the rate of change in the thickness of the thin film is monitored to obtain the regulated value.

8. A plasma processing method comprising:
newly introducing a process gas into an evacuated process chamber to generate plasma, a substrate having a thin film formed thereon being located in the evacuated process chamber;
performing a plasma processing of the thin film to reduce a thickness of the thin film;
exhausting the process gas from the evacuated process chamber;
introducing again at least a part of the process gas exhausted from the process chamber into the process chamber while processing the thin film;
monitoring a rate of change in a thickness of the thin film corresponding to a circulating ratio of the process gas into the process chamber, the circulating ratio being a ratio of a flow rate of the process gas introduced again into the process chamber to a flow rate of an entire introduced gas, the flow rate of the entire introduced gas being a sum of the newly introduced process gas and the exhausted process gas introduced again; and
controlling an introducing condition of the process gas into the process chamber so as to adjust the rate of change in the thickness of the thin film to a regulated value, the introducing condition of the process gas being controlled in accordance with changing the circulating ratio,
wherein the regulated value is a rate of change in the thickness of the thin film obtained before changing the circulating ratio.

9. The plasma processing method according to claim 8, wherein the change in the circulating ratio is brought about by changing the flow rate of the process gas newly introduced into the process chamber.

10. The plasma processing method according to claim 8, wherein the change in the circulating ratio is brought about by changing the flow rate of the process gas introduced again into the process chamber.

11. The plasma processing method according to claim 8, wherein the process gas introduced into the process chamber contains a gaseous component having C and F, the thin film is a silicon oxide film processed by an etching process, and the rate of change in the thickness of the thin film is obtained by monitoring an intensity of light emission from $CF_2$ radicals.

12. The plasma processing method according to claim 8, wherein at least a part of the process gas exhausted from the process chamber is introduced again into the process chamber without adjusting substantially components of the process gas.

13. The plasma processing method according to claim 8, wherein before introducing again at least a part of the process gas, monitoring a rate of change in the thickness of the thin film to obtain the regulated value.

14. A plasma processing method comprising:
newly introducing a process gas into an evacuated process chamber to generate plasma;
performing a plasma processing of a target object;
exhausting the process gas from the evacuated process chamber;
introducing again at least a part of the process gas exhausted from the process chamber into the process chamber;
obtaining a predetermined property value to monitor a state of the plasma of the process gas within the process chamber; and
controlling an introducing condition of the process gas into the process chamber so as to adjust the predetermined property value to a regulated value, the introducing condition of the process gas being controlled in accordance with changing a circulating ratio, which is a ratio of a flow rate of the process gas introduced again into the process chamber to a flow rate of an entire gas introduced into the process chamber, the flow rate of the entire introduced gas being a sum of the newly introduced process gas and the exhausted process gas introduced again, wherein the target object is a silicon oxide film attached to an inner wall of the process chamber; the silicon oxide film is removed by the plasma processing; the state of the plasma is correlated to a removal rate of the silicon oxide film; and the regulated value is a property value representing that the removal rate is a maximum.

15. The plasma processing method according to claim 14, wherein the process gas is a gaseous mixture containing C and F, and the property value represents a light emission intensity of $SiF_4$.

* * * * *